(12) United States Patent
Kamei

(10) Patent No.: US 6,757,197 B2
(45) Date of Patent: Jun. 29, 2004

(54) FILE STORAGE TYPE NON-VOLATILE SEMICONDUCTOR MEMORY DEVICE

(75) Inventor: Teruhiko Kamei, Yokohama (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/385,661

(22) Filed: Mar. 12, 2003

(65) Prior Publication Data

US 2003/0185054 A1 Oct. 2, 2003

(30) Foreign Application Priority Data

Mar. 20, 2002 (JP) ........................................ 2002-077857

(51) Int. Cl.[7] .............................................. G11C 16/06
(52) U.S. Cl. ................. 365/185.23; 365/63; 365/230.03
(58) Field of Search ............................. 365/185.23, 63, 365/230.03

(56) References Cited

U.S. PATENT DOCUMENTS

| | | | |
|---|---|---|---|
| 5,408,115 A | | 4/1995 | Chang |
| 5,422,504 A | | 6/1995 | Chang et al. |
| 5,494,838 A | | 2/1996 | Chang et al. |
| 5,659,505 A | * | 8/1997 | Kobayashi et al. .... 365/185.29 |
| 5,969,383 A | | 10/1999 | Chang et al. |
| 6,177,318 B1 | | 1/2001 | Ogura et al. |
| 6,248,633 B1 | | 6/2001 | Ogura et al. |
| 6,255,166 B1 | | 7/2001 | Ogura et al. |
| 6,587,380 B2 | * | 7/2003 | Kanai et al. ........... 365/185.28 |
| 6,587,381 B2 | * | 7/2003 | Kanai et al. ........... 365/185.28 |
| 6,646,916 B2 | * | 11/2003 | Kamei ................... 365/185.11 |
| 6,650,591 B2 | | 11/2003 | Owa |
| 6,654,282 B2 | | 11/2003 | Kanai |
| 6,697,280 B2 | | 2/2004 | Natori |
| 2002/0181267 A1 | | 12/2002 | Owa |
| 2002/0191453 A1 | | 12/2002 | Owa |
| 2003/0007194 A1 | | 1/2003 | Kamei et al |
| 2003/0020123 A1 | | 1/2003 | Kanai |

(List continued on next page.)

FOREIGN PATENT DOCUMENTS

| | | |
|---|---|---|
| JP | A 7-161851 | 6/1995 |
| JP | B1 2978477 | 9/1999 |
| JP | A 2001-156188 | 6/2001 |

OTHER PUBLICATIONS

Yutaka Hayashi et al., "Twin MONOS Cell with Dual Control Gates," 2000, IEEE VLSI Technology Digest.

(List continued on next page.)

Primary Examiner—Michael S. Lebentritt
Assistant Examiner—Tuan T. Nguyen
(74) Attorney, Agent, or Firm—Oliff & Berridge, PLC

(57) ABSTRACT

A file storage type non-volatile semiconductor memory device suitable for simultaneously reading data from memory cells or programming data to memory cells, the number of bits of the data being greater than the number of I/O terminals, has a plurality of sector regions obtained by dividing a memory cell array region in a column direction. Each of the sector regions includes four main control gate lines extending in a row direction, a plurality of control gate driver sections which drive the main control gate lines, and a plurality of sub control gate lines extending in the column direction. Each of the sub control gate lines is connected in common with first and second control gates which are adjacent to each other in the row direction and belonged to different two of the memory cells which are adjacent to each other in the row direction. The sub control gate lines are sequentially connected to one of the four main control gate lines in the row direction.

8 Claims, 7 Drawing Sheets

U.S. PATENT DOCUMENTS

| | | |
|---|---|---|
| 2003/0025149 A1 | 2/2003 | Kanai |
| 2003/0025150 A1 | 2/2003 | Kanai et al. |
| 2003/0027411 A1 | 2/2003 | Kamei |
| 2003/0034530 A1 | 2/2003 | Kamei |
| 2003/0072191 A1 | 4/2003 | Kamei |
| 2003/0072193 A1 | 4/2003 | Kamei et al. |
| 2003/0076717 A1 | 4/2003 | Natori |
| 2003/0095443 A1 | 5/2003 | Natori |
| 2003/0103388 A1 | 6/2003 | Natori |
| 2003/0123303 A1 | 7/2003 | Kamei |
| 2003/0137875 A1 | 7/2003 | Natori |
| 2003/0164517 A1 | 9/2003 | Kamei et al. |
| 2003/0174558 A1 | 9/2003 | Kamei et al. |
| 2003/0174561 A1 | 9/2003 | Kamei et al. |
| 2003/0179609 A1 | 9/2003 | Natori |
| 2003/0179621 A1 | 9/2003 | Kamei et al. |
| 2003/0198102 A1 | 10/2003 | Kamei et al. |
| 2003/0198103 A1 | 10/2003 | Kamei et al. |

OTHER PUBLICATIONS

Kuo–Tung Chang et al., "A New SONOS Memory Using Source–Side Injection for Programming," IEEE Electron Device Letters, vol. 19, No. 7, Jul. 1998, pp 253–255.

Wei–Ming Chen et al., "A Novel Flash Memory Device with S Plit Gate Source Side Injection and ONO Charge Storage Stack (SPIN)," 1997, VLSI Technology Digest, pp 63–64.

* cited by examiner

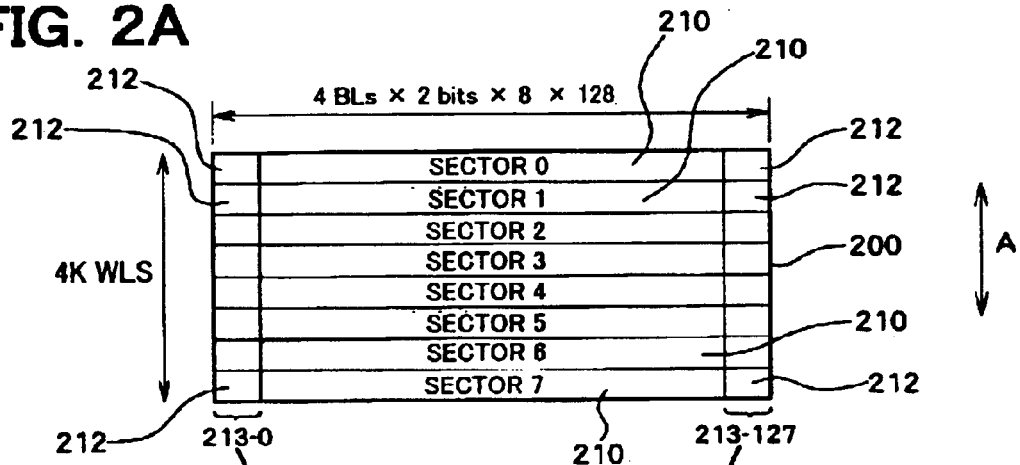
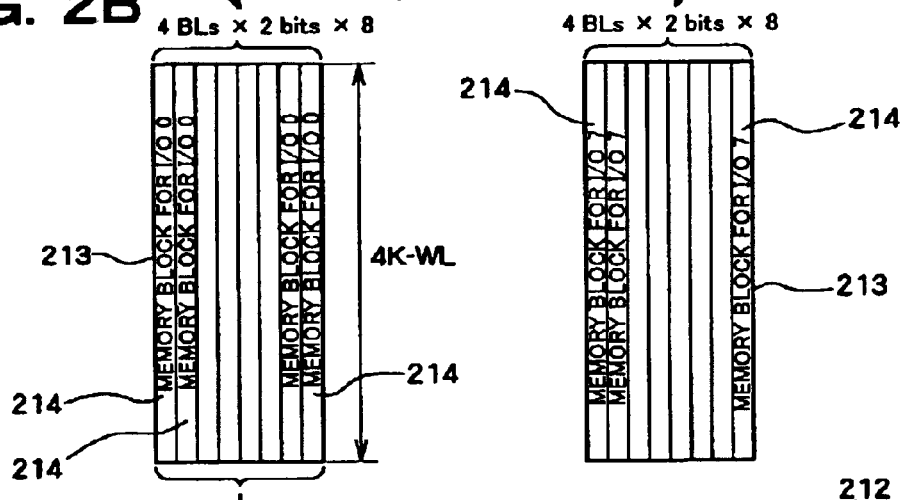
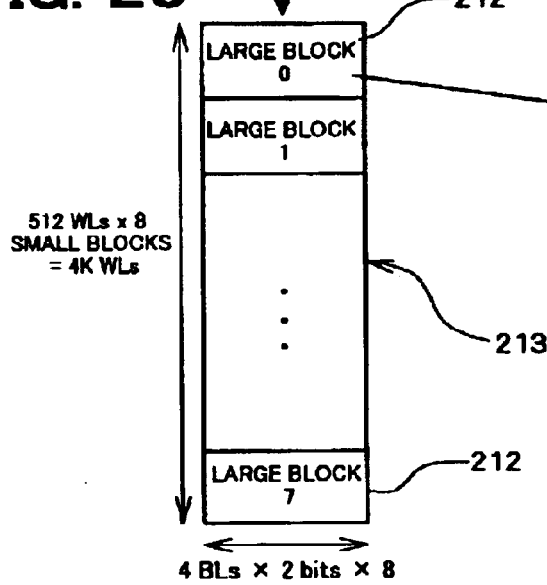
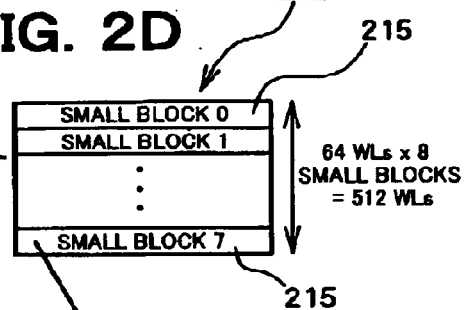
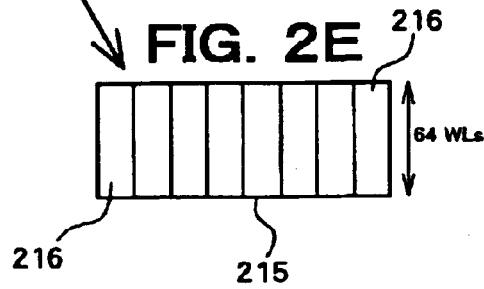

FILE STORAGE TYPE NON-VOLATILE SEMICONDUCTOR MEMORY DEVICE

Japanese Patent Application No. 2002-77857, filed on Mar. 20, 2002, is hereby incorporated by reference in its entirety.

BACKGROUND OF THE INVENTION

The present invention relates to a file storage type non-volatile semiconductor memory device including memory cells, each of the memory cells having two non-volatile memory elements controlled by one word gate and two control gates.

As one type of non-volatile semiconductor memory device, a MONOS (Metal-Oxide-Nitride-Oxide-Semiconductor or -Substrate) non-volatile semiconductor memory device is known. In the MONOS non-volatile semiconductor memory device, a gate insulating layer between a channel and a gate is formed by stacking a silicon oxide film, silicon nitride film, and silicon oxide film, and charges are trapped in the silicon nitride film.

The MONOS non-volatile semiconductor memory device is disclosed by Y. Hayashi, et al, in 2000 Symposium on VLSI Technology Digest of Technical Papers, pp. 122–123. This literature discloses a twin MONOS flash memory cell including two non-volatile memory elements (MONOS memory elements or cells) controlled by one word gate and two control gates. Specifically, one flash memory cell has two charge trap sites.

A memory cell array region is formed by arranging a plurality of twin MONOS flash memory cells having such a structure in a row direction and a column direction.

Two bit lines, one word line, and two control gate lines are connected with the twin MONOS flash memory cell.

The operations of this type of flash memory include erasing, programming, and reading of data. Data is programmed in or read from a plurality of bits of selected cells (selected non-volatile memory elements) at the same time. Each bit signal is input or output through an I/O line.

Therefore, each of the bit lines connected with each of an arbitrary number of memory cells is connected in common with one I/O terminal through pass gate circuits. One bit line is connected with one I/O terminal through one of the pass gate circuits. Data is read or programmed in a unit of 8 bits or 16 bits by performing the read or program operation for a plurality of I/O terminals at the same time, for example.

BRIEF SUMMARY OF THE INVENTION

The present invention may provide a file storage type non-volatile semiconductor memory device suitable for simultaneously reading data from memory cells or programming data to memory cells, the number of bits of the data being greater than the number of I/O terminals.

According to the present invention, there is provided a file storage type non-volatile semiconductor memory device comprising:

a memory cell array region including a plurality of memory cells arranged in a column direction and a row direction, each of the memory cells having first and second non-volatile memory elements that are controlled by one word gate and first and second control gates;

a plurality of sector regions obtained by dividing the memory cell array region in the column direction;

a plurality of control gate driver sections each of which is provided for each of the sector regions;

four main control gate lines extending in the row direction in each of the sector regions; and a plurality of sub control gate lines extending in the column direction in each of the sector regions, and each of the sub control gate lines connecting the first and second control gates which are adjacent to each other in the row direction and belonged to different two of the memory cells which are adjacent to each other in the row direction, wherein the sub control gate lines are sequentially connected to one of the four main control gate lines in the row direction, in each of the sector regions.

In this configuration, the memory cells belonging to the same row in one sector are selected by potential setting of the word gate. Selection of the cells in the column direction is performed by setting a potential corresponding to a mode such as a read or program mode to each of the four sub control gate lines adjacent to one another in the row direction through the four main control gate lines in one sector region driven by one of the control gate driver sections.

The reason why there are four main control gate lines is because the minimum number of memory cells necessary for driving one cell when addressing in a binary system is four. So that one of each four memory cells adjacent in the row direction among the memory cells in the same row is selected. Therefore, this configuration is advantageous for reading from or programming in a number of cells at the same time. Moreover, since each of the main and sub control gate lines is independent in a corresponding sector, occurrence of disturbance in the non-selected cells in the sector regions other than the sector region including the selected cell can be prevented when programming or erasing data.

In each of the sector regions, all the sub control gate lines are directly connected with the four main control gate lines, and there is no control-gate select gate. It is unnecessary to provide the control-gate select gate and a driver for driving the control-gate select gate, so that the mounting area is saved and mounting at high density can be implemented.

This file storage type non-volatile semiconductor memory device may further comprise:

a plurality of main bit lines extending in the column direction in the memory cell array region, each of the main bit lines connecting the first and second non-volatile memory elements which are adjacent to each other in the row direction;

a plurality of column select gates each of which is provided in each of the main bit lines;

$2^M$ latch circuits, each of which is connected in common with each four of the column select gates;

$2^N$ input/output terminals ($N<M$); and $2^{(M-N)}$ latch select gates provided between each of the $2^N$ input/output terminals and the $2^{(M-N)}$ latch circuits, the $2^{(M-N)}$ latch circuits being connected in common to one of the $2^N$ input/output terminals.

In this configuration, $2^M$ bits (or 128 bytes, when M=10) of data of which the number of bits is greater than the number of I/O terminals may be simultaneously read or programmed between the $2^M$ latch circuits and the memory cell array region.

When reading data, $2^M$ bits of data (or 128 bytes, for example) is stored in the $2^M$ (or 128×8, for example) latch circuits. After that, the $2^{(M-N)}$ latch select gates provided between each of the $2^N$ (or 8, when N=3) input/output terminals and the $2^{(M-N)}$ (or 128, when M=10 and N=3) latch circuits may be sequentially turned on, so that $2^{(M-N)}$ times operations can be performed to output the $2^M$ bits of data from the $2^N$ input/output terminals. Each of the latch circuits may include a sense amplifier.

Programming of data can be performed in the same manner as reading. Specifically, in data programming, the $2^{(M-N)}$ latch select gates provided between each of the input/output terminals and the $2^{(M-N)}$ latch circuits may be sequentially turned on, so that $2^{(M-N)}$ times operations can be performed to write the $2^M$ bits of data from the $2^N$ input/output terminals to the $2^M$ latch circuits.

In this file storage type non-volatile semiconductor memory device, each of the sector regions may include:

a plurality of block regions divided in the row direction;

a plurality of sub bit lines disposed in the column direction in each of the block regions, each of the sub bit lines being connected in common with the adjacent first and second non-volatile memory elements respectively belonged to two of the memory cells which are adjacent to each other in the row direction; and bit line select gates each of which is disposed between each of the main bit lines and each of the sub bit lines in the same column as the main bit lines.

The load capacitance connected with the main bit line can be reduced by connecting only the sub bit lines in a selected block region to the main bit line through the bit-line select gates.

Each of the first and second non-volatile memory elements may have an ONO film formed of an oxide film (O), a nitride film (N), and an oxide film (O) as a charge trap site, but another structure can be employed alternatively.

BRIEF DESCRIPTION OF THE SEVERAL VIEWS OF THE DRAWING

FIG. 2A is a plan view showing the layout of the entire non-volatile semiconductor memory device of FIG. 1; FIG. 2B is a plan view showing two sector regions shown in FIG. 2A; FIG. 2C is a plan view showing one memory block in FIG. 2B; FIG. 2D is a plan view showing one large block in FIG. 2C; and FIG. 2E is a plan view showing one small block in FIG. 2D.

DETAILED DESCRIPTION OF THE EMBODIMENT

Figure 1:
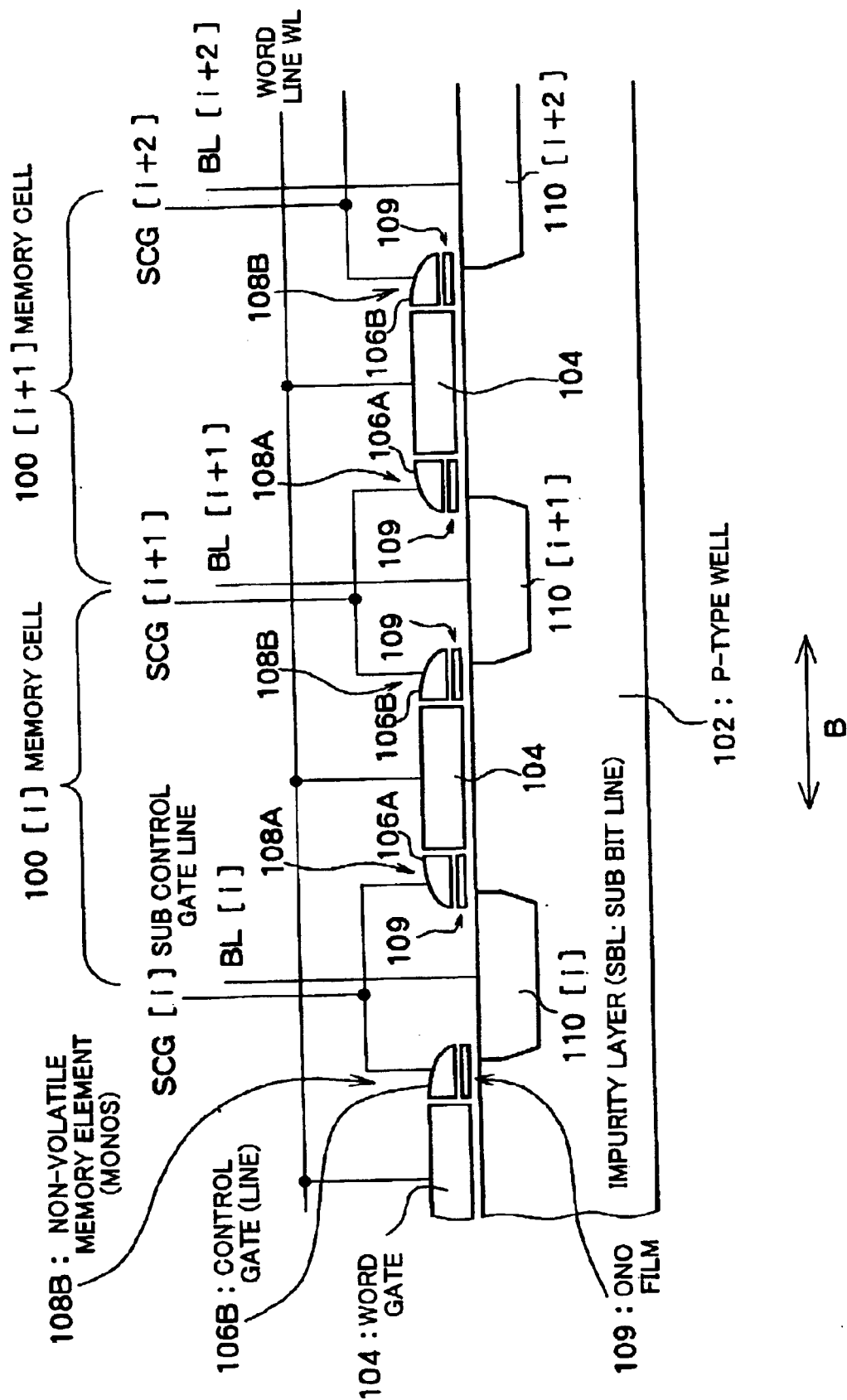
FIG. 1 is a cross-sectional view showing memory cells used in a non-volatile semiconductor memory device according to one embodiment of the present invention.

An embodiment of the present invention is described below with reference to the drawings.
Memory Cell FIG. 1 shows a cross section of a non-volatile semiconductor memory device. In FIG. 1, one memory cell 100 includes a word gate 104 which is formed of a material containing polysilicon or the like on a P-type well 102 through a gate oxide film, first and second control gates 106A and 106B, and first and second memory elements (MONOS memory elements) 108A and 108B.

The first and second control gates 106A and 106B are formed on opposite sidewalls of the word gate 104 and are electrically insulated from the word gate 104.

Each of the first and second memory elements 108A and 108B is formed by stacking an oxide film (O), a nitride film (N), and an oxide film (O) between either the first control gate 106A or the second control gate 106B formed of polysilicon corresponding to the M (Metal) of MONOS and the P-type well 102. The first and second control gates 106A and 106B may be formed of a conductive material such as a silicide.

As described above, one memory cell 100 includes the first and second MONOS memory elements 108A and 108B having split gates (first and second control gates 106A and 106B). One word gate 104 is shared by the first and second MONOS memory elements 108A and 108B.

Each of the first and second MONOS memory elements 108A and 108B functions as a charge trap site. Each of the first and second MONOS memory elements 108A and 108B is capable of trapping charges in the ONO film 109.

As shown in FIG. 1, the word gates 104 arranged at an interval in a row direction (second direction B in FIG. 1) are connected in common with one word line WL formed of a polycide or the like.

The control gates 106A and 106B shown in FIG. 1 extend in a column direction (first direction A perpendicular to the surface of FIG. 1) and are shared by the memory cells 100 arranged in the column direction. Therefore, the control gates 106A and 106B are also called control gate lines.

A sub control gate line SCG [i+1] formed of a metal layer higher than the word gate, the control gate, and the word line is connected with the control gate line 106B of the [i]th memory cell 100[$i$] and the control gate line 106A of the [i+1]th memory cell 100[$i$+1].

An [i+1]th impurity layer 110[$i$+1] which is shared by the MONOS memory element 108B of the [i]th memory cell 100[$i$] and the MONOS memory element 108A of the [i+1]th memory cell 100[$i$+1] is formed in the P-type well 102.

The impurity layers 110[$i$], [i+1], and [i+2] are N-type impurity layers formed in the P-type well, for example. The impurity layers 110[$i$], [i+1], and [i+2] function as bit lines which extend along the column direction (first direction A perpendicular to the surface of FIG. 1) and are shared by the memory cells 100 arranged in the column direction. Therefore, the impurity layers 110[$i$], [i+1], and [i+2] are also called bit lines BL[i], [i+1], and [i+2].
Non-Volatile Semiconductor Memory Device The entire configuration of the non-volatile semiconductor memory device formed by using the above-described memory cells 100 is described below with reference to FIGS. 2A to 2E.

FIG. 2A is a view showing a planar layout of one chip of the non-volatile semiconductor memory device. The non-volatile semiconductor memory device includes a memory cell array region 200. The memory cell array region 200 is divided in the column direction A and has 0th to seventh sector regions 210 (eight in total), for example.

The sector region 210 is a minimum unit of data erasure. Data stored in the sector region 210 is erased either collectively or by time division.

The memory cell array region 200 has 4K word lines WL and 4K bit lines BL, for example. In the present embodiment, since the two MONOS memory elements 108A and 108B are connected with one bit line BL, the 4K bit lines BL mean a storage capacity of 8K bits.

Each of the 0th to seventh sector regions 210 is divided into 128 large blocks 212 in the row direction, for example.

As shown in FIG. 2A, the memory cell array 200 is divided into 218 longitudinal block columns 213-0 to 213-127 taking the relationship with I/O terminals into consideration, for example.

One longitudinal block column 213 is made up of eight large blocks 212.

As shown in FIGS. 2B and 2C, the longitudinal block column 213 is divided in the row direction B and has eight I/O memory block columns (memory blocks corresponding to input/output bits) 214, for example. As shown in FIG. 2B, each of the I/O memory block columns 214 has 4K (4096) word lines WL.

Data is read from or written in the 16 longitudinal block columns 213-0 to 213-15 on the left end through the I/O0. Data is read from or written in the 16 longitudinal block columns 213-112 to 213-127 on the right end through the I/O7. Data is read from or written in the 16 longitudinal block columns 213-i to 213-(i+15) between the longitudinal block columns 213-15 and 213-112 through the I/O1 to the I/O6.

As shown in FIG. 2D, each of the large blocks 212 is divided into eight small blocks 215 in the column direction A. As shown in FIG. 2E, each of the small blocks 215 has 64 word lines WL. Each of the small blocks 215 is divided into eight small memory blocks 216 in the row direction.

Main and Sub Control Gate Lines

Figure 3:
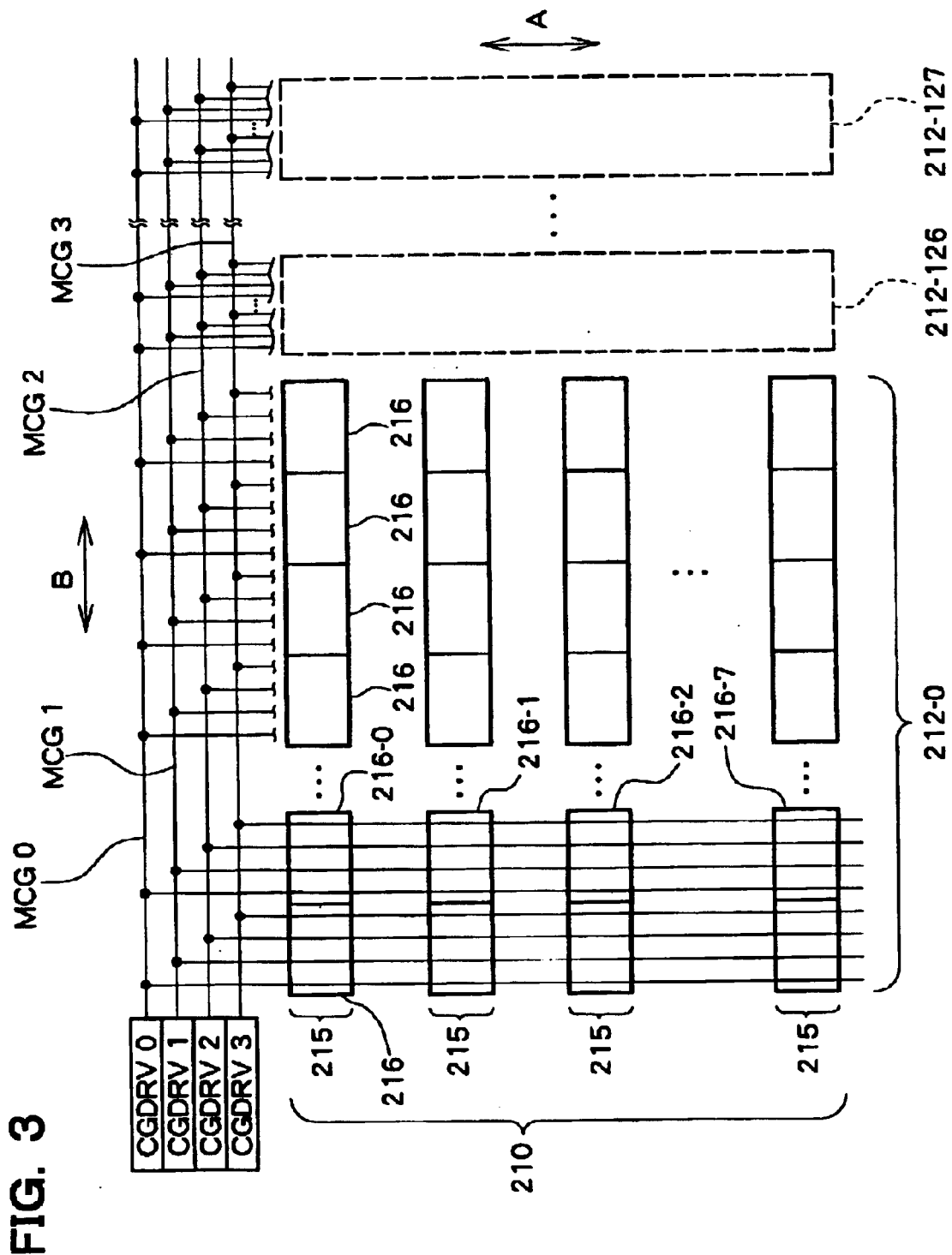
FIG. 3 is a schematic view that is illustrative of the relationship between the main and sub local control gate lines and small memory blocks in one sector region.

FIG. 3 shows the relationship between main control gate lines MCG and sub control gate lines SCG in one sector region 210.

As shown in FIG. 3, the four main control gate lines MCG0 to MCG3 extend in the row direction B in one sector region 210. Control gate drivers CGDRV0 to CGDRV3 are provided to respectively drive the four main control gate lines MCG0 to MCG3. A number of sub control gate lines SCG extend in the column direction A across the entire area of one sector region 210. Each of the sub control gate lines SCG is sequentially connected with one of the four main control gate lines MCG0 to MCG3 in the row direction. The sub control gate lines connected with the main control gate line MCG0 are referred to as the sub control gate lines SCG0. The sub control gate lines SCG1 to SCG3 are respectively connected with the main control gate lines MCG1 to MCG3.

As shown in FIG. 3, the four sub control gate lines SCG0 to SCG3 are shared by the 64 small memory blocks 216 arranged in the same column in one sector region 210.

FIG. 3 shows the relationship between the main and sub control gate lines in one sector region 210. However, the relationship shown in FIG. 3 also applies to other sector regions 210.

In the present embodiment, all the memory cells 100 in one sector region 210 can be set at a control gate potential separately for each sector region 210 by using the above configuration.

Therefore, the control gate potential is supplied to only one sector region 210 including the selected cell. The control gate potential is not supplied to other sector regions 210. This prevents occurrence of disturbance in the non-selected cells in the non-selected sector regions 210 when programming or erasing data.

In each of the sector regions 210, all the sub control gate lines SCG are directly connected with the four main control gate lines MCG, and a control gate select gate is not present. Therefore, it is unnecessary to dispose the control gate select gate and a driver which drives the control gate select gate, whereby mounting at high density can be realized since the area occupied by the control gate select gate and the driver is decreased. In particular, since a well differing from the well of the memory cells 100 is necessary for the control gate select gate, the number of steps can be decreased by omitting the control gate select gate. This is highly advantageous from the viewpoint of manufacture.

Figure 4:
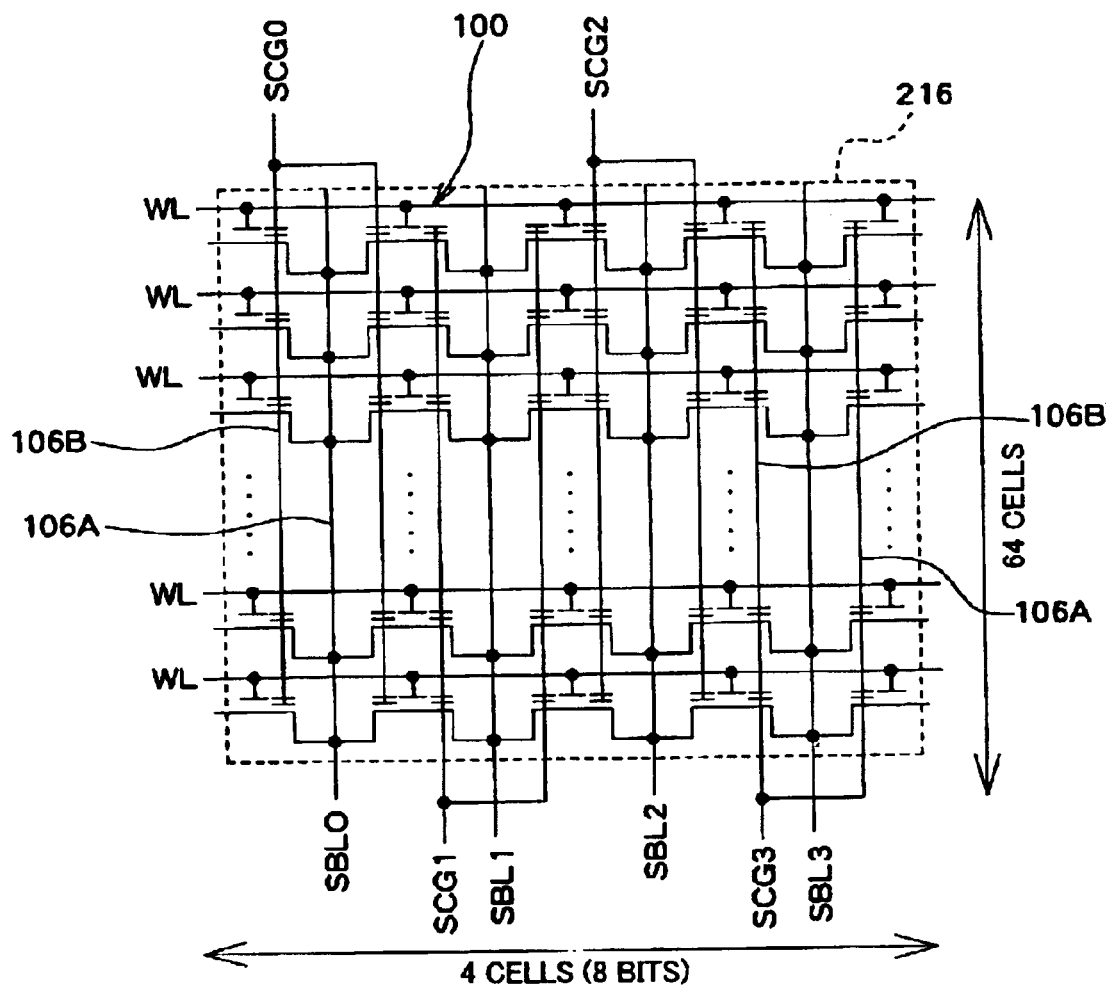
FIG. 4 is a circuit diagram showing the small memory block in FIGS. 2E and 3.

In the small memory block 216 shown in FIGS. 2E and 3, 64×4 memory cells 100 are arranged in the column direction and the row direction as shown in FIG. 4, for example. The four sub control gate lines SCG0 to SCG3, four sub bit lines SBL0 to SBL3 as data input/output lines, and 64 word lines WL are connected with one small memory block 216, for example.

Each of the second control gates 106B of the memory cells in the even-numbered column (0th column or second column) and each of the first control gates 106A of the memory cells in the odd-numbered column (first column or third column) are connected in common with the even-numbered sub control gate lines SCG0 and SCG2. Each of the second control gates 106B of the memory cells in the odd-numbered column (first column or third column) and each of the first control gates 106A of the memory cells in the even-numbered column (second column or fourth column) are connected in common with the odd-numbered sub control gate lines SCG1 and SCG3.

Figure 5:
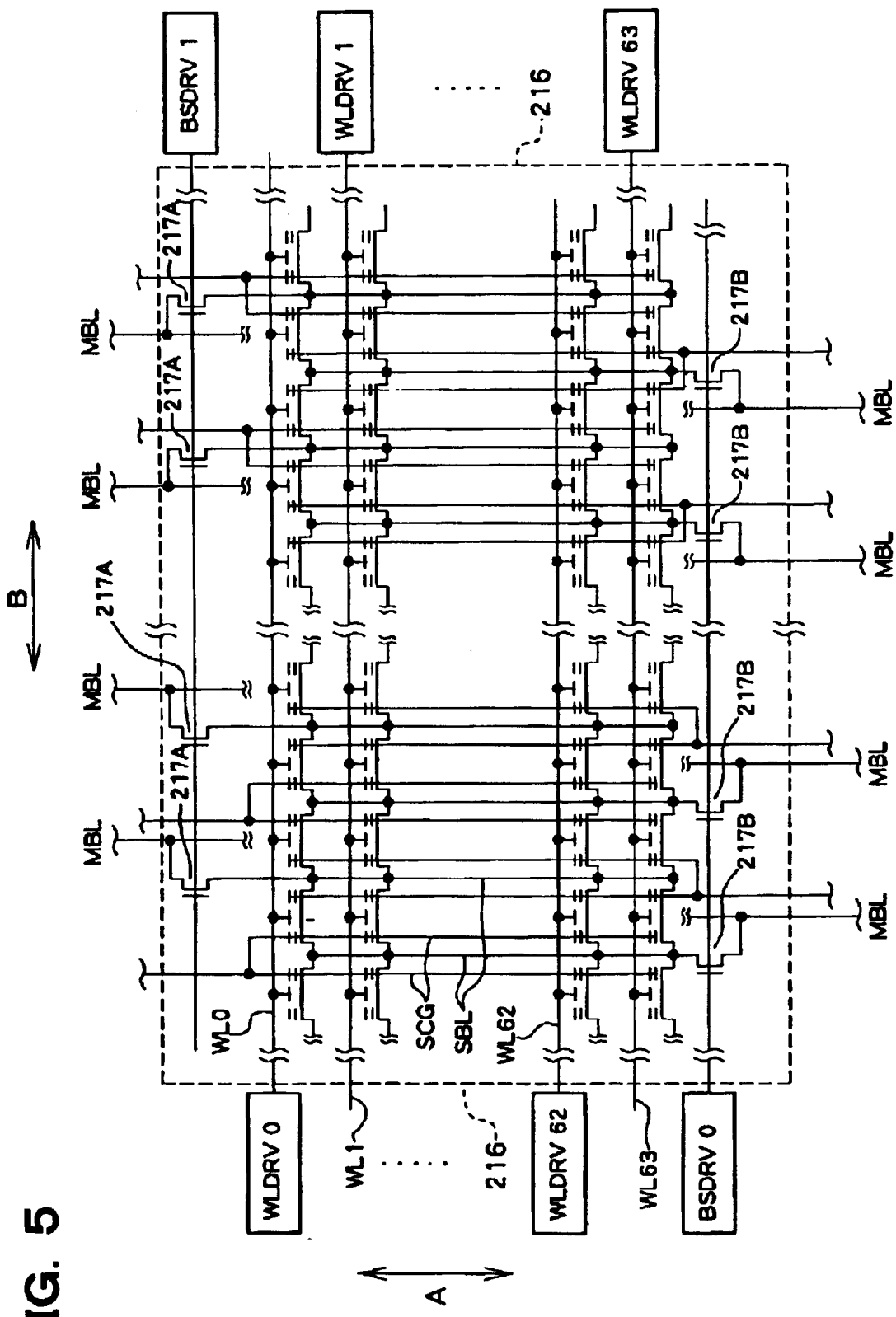
FIG. 5 is a schematic view that is illustrative of the small memory blocks in the same row and a peripheral circuit.

FIG. 5 shows the small memory blocks 216 arranged in the same row (only two small memory blocks on opposite ends in the row direction are shown in FIG. 5 and others are omitted). The 64 word lines WL0 to WL63 are shared by each of the small memory blocks 216 in the same row.

Local word line drivers WLDRV0, . . . WLDRV62 which drive the even-numbered word lines WL0, 2, . . . 62 are disposed on the side of the small memory block 216 on the left end. Local word line drivers WLDRV1, . . . WLDRV63 which drive the odd-numbered word lines WL1, 3, . . . 63 are disposed on the side of the small memory block 216 on the right end.

Each of the sub bit lines SBL0 (impurity layers) disposed for each small memory block 216 is connected with the main bit line MBL, which is a metal interconnect, through a bit line select gate 217A or 217B which is a bit line select switching element. The four main bit lines MBL are shared by the small memory blocks 216 arranged in the same column. The bit line select gates 217A connected with the even-numbered sub bit lines SBL are driven by a bit line select driver BSDRV1. The bit line select gates 217B connected with the odd-numbered sub bit lines SBL are driven by a bit line select driver BSDRV0.

Data Input/Output Circuit

Figure 6:
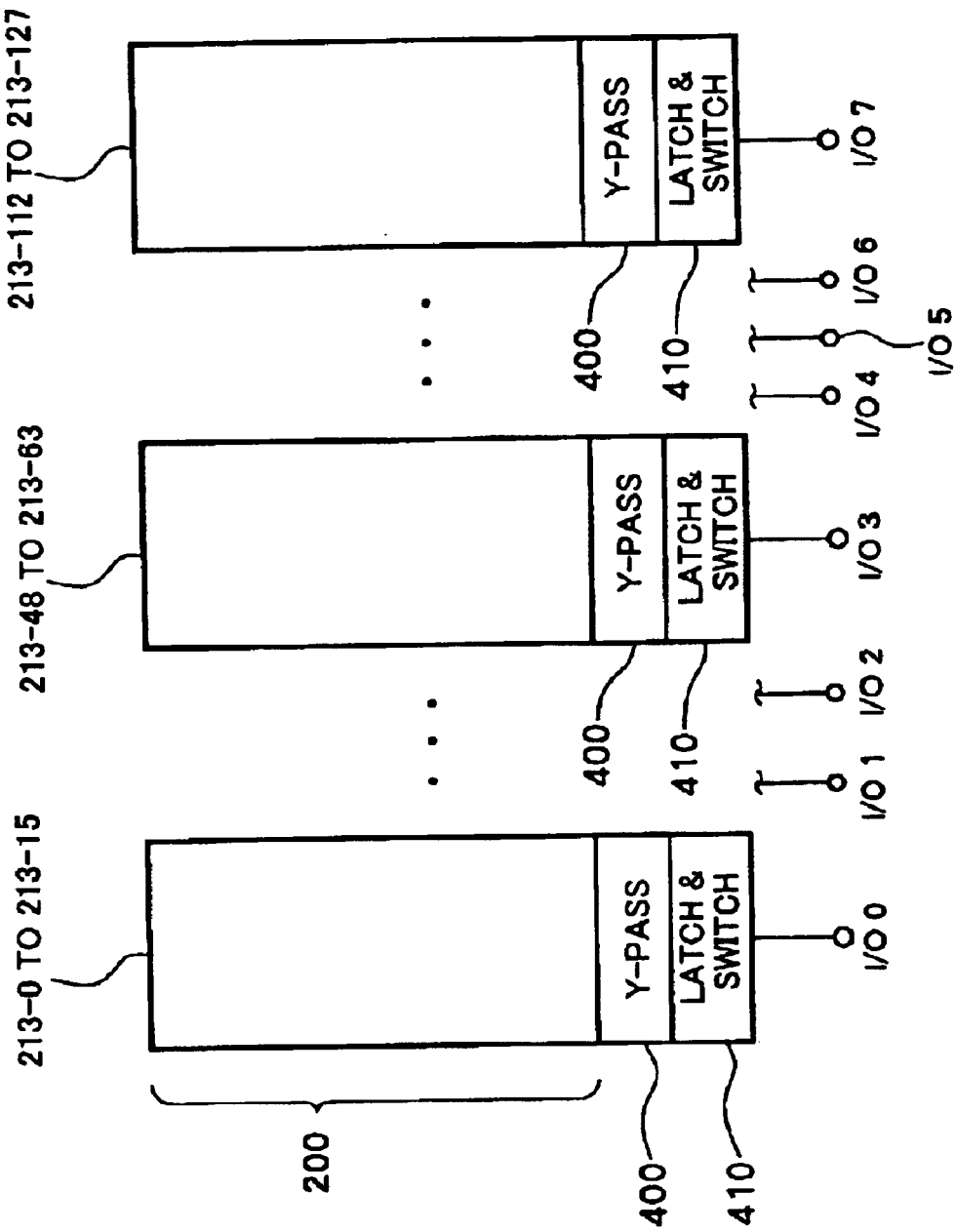
FIG. 6 is a schematic view that is illustrative of the relationship between I/O terminals and a memory cell array.

FIG. 6 shows the relationship between the memory cell array 200 and the I/O0 to the I/O7. As shown in FIG. 6, one I/O terminal is disposed for the 16 longitudinal block columns 213-i to 213-(i+15). For example, the I/O0 is provided to the longitudinal block columns 213-0 to 213-15.

A Y-pass circuit 400 and a latch & switch circuit 410 are provided between the longitudinal block columns 213-0 to 213-15 and the I/O0. The Y-pass circuits 400 and the latch & switch circuits 410 are also provided between other longitudinal block columns and the I/O terminals.

Figure 7:
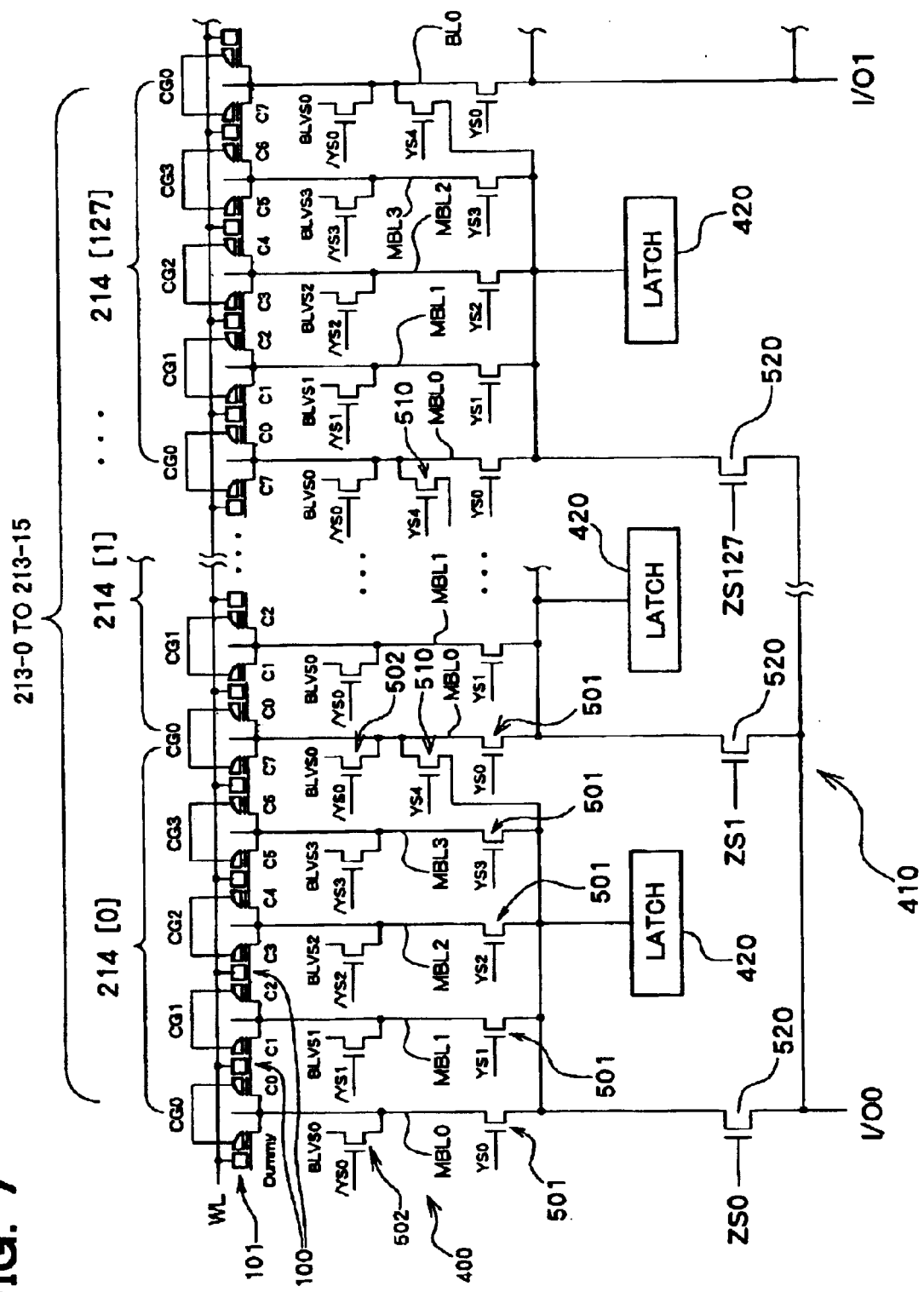
FIG. 7 is a schematic view that is illustrative of a circuit connected to an I/O0 in FIG. 6.

FIG. 7 shows the details of the Y-pass circuit 400 and the latch & switch circuit 410 connected with the longitudinal block columns 213-0 to 213-15 shown in FIG. 6. As is clear from FIGS. 2A and 2B, since the eight I/O memory block columns 214 are disposed in one longitudinal block column 213, 8×16=128 of I/O memory block columns 214[0] to 214[127] are present in the 16 longitudinal block columns 213-0 to 213-15 as shown in FIG. 7.

The four memory cells 100 are provided in the same row in one I/O block column 214. Eight cells (non-volatile memory elements) provided in the four memory cells 100 are defined as cells C0 to C7, as shown in FIG. 7. Dummy cells 101 are disposed on the end of each row.

One latch circuit 420 is provided to each of the I/O block columns 213. The Y-pass circuit 400 is used to establish a path through which data read from or written in one of the eight cells C0 to C7 present in one I/O block column 213 is transmitted between the cell and one latch circuit 420.

The 128 I/O block columns 214[0] to 214[127] are present in the 16 longitudinal memory block columns 213-0 to 213-15 corresponding to the I/O0. The 128 latch circuits 420 are present in the 16 longitudinal memory block columns 213-0 to 213-15 corresponding to the I/O0.

128 latch select gates 520 which are on/off controlled by gate signals ZS0 to ZS127 which are sequentially activated in order to selectively connect the I/O0 with the 128 latch circuits 420.

Data can be sequentially transferred between the I/O0 and the 128 latch circuits 420 by allowing the 128 latch select gates 520 to be sequentially turned on.

In the present embodiment, since the $128 \times 8 = 2^{10}$ of longitudinal block columns 214 are present in the memory cell array 200, the $2^{10}$ (or $2^M$, when M=10) latch circuits 420 are present. The number of I/O terminals is eight in total (or $2^N$, when N=3).

The $2^{(M-N)}$ (or 128, when M=10 and N=3) latch circuits 210 are connected with each of the $2^N$ (or eight, when N=3) I/O terminals through the $2^{(M-N)}$ latch select gates 520.

Therefore, $2^M$ bits (or 128 bytes, when M=10) of data can be simultaneously read or programmed between the $2^M$ latch circuits 420 and the memory cell array 200.

When reading data, this data is read simultaneously from one cell in each of the I/O block columns 214, and $2^M$ bits (or 128 bytes, for example) of data is stored in the $2^M$ (or 128×8, for example) latch circuits 420. After that, the $2^{(M-N)}$ latch select gates provided between each of the $2^N$ (or eight, when N=3) I/O terminals and the $2^{(M-N)}$ (or 128, when M=10 and N=3) latch circuits 420 are sequentially turned on, whereby $2^{(M-N)}$ times operations are performed to output $2^M$ bits of data from the $2^N$ I/O terminals. Data can be programmed in the same manner as described above.

Y-Pass Circuit

As shown in FIG. 7, each pair of the memory cells 100 adjacent in the row direction are connected through connect lines 600. The main bit lines MBL are connected with each of the connect lines 600. The main bit lines MBL disposed in one I/O block column 214 are referred to as MBL0 to MBL3, as shown in FIG. 7. In the above-described embodiment, the sub bit lines SBL are connected with the connect lines 600, and the sub bit lines SBL are connected with the main bit lines MBL through bit line select transistors. In FIG. 7, the sub bit lines SBL and the main bit lines MBL are collectively illustrated as the main bit lines MBL for convenience.

One end of each of the transistors 501 is connected with each of the main bit lines MBL0 to MBL3. The transistors 501 are hereinafter referred to as first select gates. One of voltages YS0 to YS3 is applied to gates of the four first select gates 501 provided corresponding to one I/O block column 214. The other end of each of the four first select gates 501 is connected in common with one of the latch circuits 420. Therefore, one of the main bit lines MBL0 to MBL3 can be connected with the latch circuit 420 by allowing one of the four first select gates 501 to be turned on.

Second transistors 502 of which the gate voltage is one of /YS0 to /YS3 are connected in the middle of the main bit lines MBL0 to MBL3. When the second transistor 502 is turned on, a voltage BLVS connected with a source of the transistor 502 is supplied to the main bit line MBL. The voltage BLVS is set at either Vdd or 0 V depending on the operation mode.

Second select gates 510 are further provided to the Y-pass circuit 400. The second select gate 510 allows the main bit line MBL0 located at the boundary between the I/O block column 214[0] and the I/O block column 214[1] to be connected with or disconnected from the latch circuit 420 provided corresponding to the I/O block column 214[0], for example. The second select gate 510 is connected with the main bit line (main bit line MBL0) which is connected with the connect line 600 between the pair of memory cells 100 disposed in the (i)th and (i+1)th block columns adjacent in the row direction and located at the boundary between the block regions. The gate voltage YS4 is supplied to the second select gate 510.

Voltages at each point when reading data in the case where one of the eight cells C0 to C7 in one I/O block column 214 is selected as the selected cell are shown in Table 1.

TABLE 1

| | | | | Read | | | | | | | | |
|---|---|---|---|---|---|---|---|---|---|---|---|---|
| Address | | | Selected | Control Gate | | | | Y-Select Gate | | | | |
| A14 | A13 | A12 | Cell | CG0 | CG1 | CG2 | CG3 | YS0 | YS1 | YS2 | YS3 | YS4 |
| 0 | 0 | 0 | C0 | 1.5 V | 3.0 V | 0 V | 0 V | 0 V | Vdd | 0 V | 0 V | 0 V |
| 0 | 0 | 1 | C1 | 3.0 V | 1.5 V | 0 V | 0 V | Vdd | 0 V | 0 V | 0 V | 0 V |
| 0 | 1 | 0 | C2 | 0 V | 1.5 V | 3.0 V | 0 V | 0 V | 0 V | Vdd | 0 V | 0 V |
| 0 | 1 | 1 | C3 | 0 V | 3.0 V | 1.5 V | 0 V | 0 V | Vdd | 0 V | 0 V | 0 V |
| 1 | 0 | 0 | C4 | 0 V | 0 V | 1.5 V | 3.0 V | 0 V | 0 V | 0 V | Vdd | 0 V |
| 1 | 0 | 1 | C5 | 0 V | 0 V | 3.0 V | 1.5 V | 0 V | 0 V | Vdd | 0 V | 0 V |
| 1 | 1 | 0 | C6 | 3.0 V | 0 V | 0 V | 1.5 V | 0 V | 0 V | 0 V | 0 V | Vdd |
| 1 | 1 | 1 | C7 | 1.5 V | 0 V | 0 V | 3.0 V | 0 V | 0 V | 0 V | Vdd | 0 V |

| Address | | | Selected | Y-Deselect Gate | | | | BL VSS | | | |
|---|---|---|---|---|---|---|---|---|---|---|---|
| A14 | A13 | A12 | Cell | /YS0 | /YS1 | /YS2 | /YS3 | BLVS0 | BLVS1 | BLVS2 | BLVS3 |
| 0 | 0 | 0 | C0 | Vdd | 0 V | Vdd | Vdd | 0 V | 0 V | Vdd | 0 V |
| 0 | 0 | 1 | C1 | 0 V | Vdd | Vdd | Vdd | 0 V | 0 V | 0 V | Vdd |
| 0 | 1 | 0 | C2 | Vdd | Vdd | 0 V | Vdd | 0 V | 0 V | 0 V | Vdd |
| 0 | 1 | 1 | C3 | Vdd | 0 V | Vdd | Vdd | Vdd | 0 V | 0 V | 0 V |

TABLE 1-continued

| | | | | | | Read | | | | | | | |
|---|---|---|---|---|---|---|---|---|---|---|---|---|---|
| 1 | 0 | 0 | C4 | Vdd | Vdd | Vdd | 0 V | Vdd | 0 V | 0 V | 0 V | | |
| 1 | 0 | 1 | C5 | Vdd | Vdd | 0 V | Vdd | 0 V | Vdd | 0 V | 0 V | | |
| 1 | 1 | 0 | C6 | 0 V | Vdd | Vdd | Vdd | 0 V | Vdd | 0 V | 0 V | | |
| 1 | 1 | 1 | C7 | Vdd | Vdd | Vdd | 0 V | 0 V | 0 V | Vdd | 0 V | | |

Table 1 shows the voltages at each point in the reverse read operation. When reading data-from the selected cell C3, only the gate voltage YS1 of the first select gate 501 is set at the voltage Vdd so that only the first select gate 501 connected with the main bit line MBL1 connected with the opposite cell C2 is turned on. Other gate voltages YS0 and YS2 to YS4 are set at 0 V.

The second select gate 510 is turned on only in the case of reading data from the selected cell C6 in the reverse read mode. In the reverse read operation, current flows through the main bit line MBL0 which belongs to the I/O block column 214[1] based on data in the selected cell C6 which belongs to the I/O block column 214[0], for example. At this time, since YS0=0 V, /YS0=0 V, and YS4=Vdd as shown in Table 1, only the second select gate 510 connected with the main bit line MBL0 is turned on. Therefore, the main bit line MBL0 in the I/O block column 214[1] is connected with the latch circuit 420. If the latch circuit 420 includes a sense amplifier, current flowing through the main bit line MBL0 can be sensed.

When reading data from the selected cell C6, the control gate lines CG2 and CG3 in the I/O block column 214[0] are respectively set at 0 V and 1.5 V, and the control gate lines CG0 and CG1 in the I/O block column 214[1] are respectively set at 3 V and 0 V.

As described above, when reading data from the selected cell C6 which belongs to the I/O block column 214[0], the read operation is performed by using the bit line and the control gate line which belong to the I/O block column 214[1] adjacent to the I/O block column 214[0].

In the case of performing the forward read operation differing from Table 1, the second select gate 510 is turned on when reading data from the selected cell C7, and current flowing through the main bit line MBL0 is sensed in the I/O0.

The voltages at each point when programming data in the case where one of the eight cells C0 to C7 in one block region 214 is selected as the selected cell is shown in Table 2.

TABLE 2

| | | | | | Program | | | | | | | |
|---|---|---|---|---|---|---|---|---|---|---|---|---|
| Address | | | Selected | Control Gate | | | | Y-Select Gate | | | | |
| A14 | A13 | A12 | Cell | CG0 | CG1 | CG2 | CG3 | YS0 | YS1 | YS2 | YS3 | YS4 |
| 0 | 0 | 0 | C0 | 5.5 V | 2.5 V | 0 V | 0 V | 7 V | 0 V | 0 V | 0 V | 0 V |
| 0 | 0 | 1 | C1 | 2.5 V | 5.5 V | 0 V | 0 V | 0 V | 7 V | 0 V | 0 V | 0 V |
| 0 | 1 | 0 | C2 | 0 V | 5.5 V | 2.5 V | 0 V | 0 V | 7 V | 0 V | 0 V | 0 V |
| 0 | 1 | 1 | C3 | 0 V | 2.5 V | 5.5 V | 0 V | 0 V | 0 V | 7 V | 0 V | 0 V |
| 1 | 0 | 0 | C4 | 0 V | 0 V | 5.5 V | 2.5 V | 0 V | 0 V | 7 V | 0 V | 0 V |
| 1 | 0 | 1 | C5 | 0 V | 0 V | 2.5 V | 5.5 V | 0 V | 0 V | 0 V | 7 V | 0 V |
| 1 | 1 | 0 | C6 | 2.5 V | 0 V | 0 V | 5.5 V | 0 V | 0 V | 0 V | 7 V | 0 V |
| 1 | 1 | 1 | C7 | 5.5 V | 0 V | 0 V | 2.5 V | 0 V | 0 V | 0 V | 0 V | 7 V |
| Address | | | Selected | Y-Deselect Gate | | | | BL VSS | | | | |
| A14 | A13 | A12 | Cell | /YS0 | /YS1 | /YS2 | /YS3 | BLVS0 | BLVS1 | BLVS2 | BLVS3 | |
| 0 | 0 | 0 | C0 | 0 V | Vdd | Vdd | Vdd | 0 V | 0 V | 0 V | Vdd | |
| 0 | 0 | 1 | C1 | Vdd | 0 V | Vdd | Vdd | 0 V | 0 V | Vdd | 0 V | |
| 0 | 1 | 0 | C2 | Vdd | 0 V | Vdd | Vdd | Vdd | 0 V | 0V | 0 V | |
| 0 | 1 | 1 | C3 | Vdd | Vdd | 0 V | Vdd | 0 V | 0 V | 0 V | Vdd | |
| 1 | 0 | 0 | C4 | Vdd | Vdd | 0 V | Vdd | 0 V | Vdd | 0 V | 0 V | |
| 1 | 0 | 1 | C5 | Vdd | Vdd | Vdd | 0 V | Vdd | 0 V | 0 V | 0 V | |
| 1 | 1 | 0 | C6 | Vdd | Vdd | Vdd | 0 V | 0 V | 0 V | Vdd | 0 V | |
| 1 | 1 | 1 | C7 | 0 V | Vdd | Vdd | Vdd | 0 V | Vdd | 0 V | 0 V | |

As shown in Table 2, the case where the second select gate 510 is turned on by setting the voltage YS4 at 7 V is the case of programming data in the selected cell C7. In this case, the selected cell C7 is connected with the latch circuit 420 through the main bit line MBL0 and the second select gate 510, whereby a program bit line voltage is supplied to the main bit line MBL0.

The control gate lines CG2 and CG3 in the I/O block column 214[0] are respectively set at 0 V and 2.5 V, and the control gate lines CG0 and CG1 in the I/O block column 214[1] are respectively set at 5.5 V and 0 V during this operation.

As described above, when programming data in the selected cell C6 which belongs to the I/O block column 214[0], the program operation is performed by using the bit line and the control gate line which belong to the I/O block column 214[1] adjacent to the I/O block column 214[0].

Since the voltage setting in one sector when erasing data is the same between the block regions, the voltage setting is as shown in Table 3.

TABLE 3

| | | | | Erase | | | | | | | | | | | | |
|---|---|---|---|---|---|---|---|---|---|---|---|---|---|---|---|---|
| Address | | | Selected | Control Gate | | | | Y-Select Gate | | | | | Y-Deselect Gate | | | |
| A14 | A13 | A12 | Cell | CG0 | CG1 | CG2 | CG3 | YS0 | YS1 | YS2 | YS3 | YS4 | /YS0 | /YS1 | /YS2 | /YS3 |
| 0 | 0 | 0 | C0 | −3 V | −3 V | −3 V | −3 V | 7 V | 7 V | 7 V | 7 V | 7 V | 0 V | 0 V | 0 V | 0 V |
| 0 | 0 | 1 | C1 | −3 V | −3 V | −3 V | −3 V | 7 V | 7 V | 7 V | 7 V | 7 V | 0 V | 0 V | 0 V | 0 V |
| 0 | 1 | 0 | C2 | −3 V | −3 V | −3 V | −3 V | 7 V | 7 V | 7 V | 7 V | 7 V | 0 V | 0 V | 0 V | 0 V |
| 0 | 1 | 1 | C3 | −3 V | −3 V | −3 V | −3 V | 7 V | 7 V | 7 V | 7 V | 7 V | 0 V | 0 V | 0 V | 0 V |
| 1 | 0 | 0 | C4 | −3 V | −3 V | −3 V | −3 V | 7 V | 7 V | 7 V | 7 V | 7 V | 0 V | 0 V | 0 V | 0 V |
| 1 | 0 | 1 | C5 | −3 V | −3 V | −3 V | −3 V | 7 V | 7 V | 7 V | 7 V | 7 V | 0 V | 0 V | 0 V | 0 V |
| 1 | 1 | 0 | C6 | −3 V | −3 V | −3 V | −3 V | 7 V | 7 V | 7 V | 7 V | 7 V | 0 V | 0 V | 0 V | 0 V |
| 1 | 1 | 1 | C7 | −3 V | −3 V | −3 V | −3 V | 7 V | 7 V | 7 V | 7 V | 7 V | 0 V | 0 V | 0 V | 0 V |

The present invention is not limited to the above-described embodiment. Various modifications can be made within the scope of the invention.

For example, the structure of the non-volatile memory elements 108A and 108B is not limited to the MONOS structure. The present invention may be applied to a non-volatile semiconductor memory device using various types of other memory cells capable of independently trapping charges at two sites by one word gate 104 and the first and second control gates 106A and 106B.

The number of sector regions, large blocks, and small blocks and the number of memory cells in the small memory block in the above embodiment are only examples. Various modifications are possible.

In FIG. 7, the second select gate 510 is provided so that the main bit line MBL0 is shared by the two adjacent I/O block columns 214. However, it is unnecessary to provide the second select gate 510 if the dummy cell 101 is provided between the two adjacent I/O block columns 214 so that the main bit line MBL0 is not shared.

What is claimed is:

1. A file storage type non-volatile semiconductor memory device comprising:

a memory cell array region including a plurality of memory cells arranged in a column direction and a row direction, each of the memory cells having first and second non-volatile memory elements that are controlled by one word gate and first and second control gates;

a plurality of sector regions obtained by dividing the memory cell array region in the column direction;

a plurality of control gate driver sections each of which is provided for each of the sector regions;

four main control gate lines extending in the row direction in each of the sector regions; and a plurality of sub control gate lines extending in the column direction in each of the sector regions, and each of the sub control gate lines connecting the first and second control gates which are adjacent to each other in the row direction and belonged to different two of the memory cells which are adjacent to each other in the row direction, wherein the sub control gate lines are sequentially connected to one of the four main control gate lines in the row direction, in each of the sector regions.

2. The file storage type non-volatile semiconductor memory device as defined in claim 1, further comprising:

a plurality of main bit lines extending in the column direction in the memory cell array region, each of the main bit lines connecting the first and second non-volatile memory elements which are adjacent to each other in the row direction;

a plurality of column select gates each of which is provided in each of the main bit lines; $2^M$ latch circuits, each of which is connected in common with each four of the column select gates; $2^N$ input/output terminals (N<M); and $2^{(M-N)}$ latch select gates provided between each of the $2^N$ input/output terminals and the $2^{(M-N)}$ latch circuits, the $2^{(M-N)}$ latch circuits being connected in common to one of the $2^N$ input/output terminals.

3. The file storage type non-volatile semiconductor memory device as defined in claim 2, wherein $2^M$ bits of data are simultaneously read or programmed between the $2^M$ latch circuits and the memory cell array region.

4. The file storage type non-volatile semiconductor memory device as defined in claim 3, wherein in data reading, the $2^{(M-N)}$ latch select gates provided between each of the input/output terminals and the $2^{(M-N)}$ latch circuits are sequentially turned on, so that $2^{(M-N)}$ times operations are performed to output the $2^M$ bits of data from the $2^N$ input/output terminals, the $2^M$ bits of data having been read out into the $2^M$ latch circuits.

5. The file storage type non-volatile semiconductor memory device as defined in claim 2, wherein each of the latch circuits includes a sense amplifier.

6. The file storage type non-volatile semiconductor memory device as defined in claim 3, wherein in data programming, the $2^{(M-N)}$ latch select gates provided between each of the input/output terminals and the $2^{(M-N)}$ latch circuits are sequentially turned on, so that $2^{(M-N)}$ times operations are performed to write the $2^M$ bits of data from the $2^N$ input/output terminals to the $2^M$ latch circuits.

7. The file storage type non-volatile semiconductor memory device as defined in claim 1, wherein each of the sector regions includes:

a plurality of block regions divided in the row direction;

a plurality of sub bit lines disposed in the column direction in each of the block regions, each of the sub bit lines being connected in common with the adjacent first and second non-volatile memory elements respectively belonged to two of the memory cells which are adjacent to each other in the row direction; and bit line select gates each of which is disposed between each of the main bit lines and each of the sub bit lines in the same column as the main bit lines.

8. The file storage type non-volatile semiconductor memory device as defined in claim 1, wherein each of the first and second non-volatile memory elements has an ONO film formed of an oxide film (O), a nitride film (N), and an oxide film (O) as a charge trap site.

* * * * *